US009466792B2

(12) United States Patent
Lin et al.

(10) Patent No.: US 9,466,792 B2
(45) Date of Patent: Oct. 11, 2016

(54) MEMORY DEVICE AND METHOD FOR FABRICATING THE SAME

(71) Applicant: MACRONIX INTERNATIONAL CO., LTD., Hsinchu (TW)

(72) Inventors: Yu-Yu Lin, New Taipei (TW); Feng-Min Lee, Changhua County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/623,654

(22) Filed: Feb. 17, 2015

(65) Prior Publication Data

US 2016/0240776 A1    Aug. 18, 2016

(51) Int. Cl.
   *H01L 45/00*         (2006.01)

(52) U.S. Cl.
   CPC ............. *H01L 45/124* (2013.01); *H01L 45/08* (2013.01); *H01L 45/1233* (2013.01); *H01L 45/146* (2013.01); *H01L 45/1616* (2013.01); *H01L 45/1633* (2013.01)

(58) Field of Classification Search
   CPC ..... G11C 5/02; G11C 5/025; G11C 11/5678; G11C 11/5685; G11C 13/0002; G11C 13/0004; G11C 13/0007; H01L 21/02614; H01L 21/02636; H01L 45/04; H01L 45/06; H01L 45/12; H01L 45/122; H01L 45/1233; H01L 45/124; H01L 45/1253; H01L 45/1273; H01L 45/145; H01L 45/146; H01L 45/16; H01L 45/1608; H01L 45/1633; H01L 45/165; H01L 45/1666; H01L 45/1683
   See application file for complete search history.

(56) References Cited

U.S. PATENT DOCUMENTS

| 7,129,133 B1 * | 10/2006 | Avanzino | H01L 51/0591 257/296 |
| 2007/0246743 A1 * | 10/2007 | Cho | C23C 16/305 257/202 |
| 2008/0090400 A1 * | 4/2008 | Cheek | H01L 27/2436 438/597 |
| 2008/0116443 A1 * | 5/2008 | Chang | H01L 27/2436 257/4 |
| 2008/0173931 A1 | 7/2008 | Ho et al. | |
| 2009/0072211 A1 * | 3/2009 | Lee | H01L 45/04 257/2 |
| 2011/0057161 A1 | 3/2011 | Sandhu et al. | |
| 2013/0193397 A1 | 8/2013 | Lin et al. | |
| 2014/0284540 A1 * | 9/2014 | Suguro | H01L 45/085 257/4 |

FOREIGN PATENT DOCUMENTS

TW        201133816 A1    10/2011

OTHER PUBLICATIONS

TIPO Office Action dated Mar. 1, 2016 in corresponding Taiwan application (No. 104106742).

\* cited by examiner

*Primary Examiner* — Eduardo A Rodela
(74) *Attorney, Agent, or Firm* — McClure, Qualey & Rodack, LLP

(57) ABSTRACT

A memory device comprises a substrate, a first electrode layer, a spacer, a memory layer and a second electrode layer. The substrate has a recess. The first electrode layer is formed in the recess and has a top surface exposed from an opening of the recess. The spacer covers on a portion of the top surface, so as to define a contact area on the top surface. The memory layer is formed on the contact area. The second electrode layer is formed on the memory layer and electrically connected to the memory layer.

14 Claims, 6 Drawing Sheets

MEMORY DEVICE AND METHOD FOR FABRICATING THE SAME

BACKGROUND

1. Technical Field

The disclosure in generally relates to a memory device and a method for fabricating the same, and more particularly to a resistive random-access memory (ReRAM) device and a method for fabricating the same.

2. Description of the Related Art

Non-volatile memory (NVM) which is able to continually store information even when the supply of electricity is removed from the device containing the NVM cells. Recently, the most widespread used NVMs are charge trap flash (CTF) memory devices. However, as semiconductor features shrink in size and pitch, the CTF memory devices have its physical limitation of operation. In order to solve the problems, a ReRAM device is thus provided.

ReRAM devices that apply difference of resistance within the memory cells thereof to implementing the erase/program operation have advantages in terms of cell area, device density, power consumption, programming/erasing speed, three-dimensional integration, multi-value implementation, and the like over FLASH memory devices, and thus have become a most promising candidate for leading products in the future memory market.

A typical ReRAM device comprises a vertical arrangement of metal layer/memory layer/metal layer structure. As a result, the ReRAM device can achieve high-density storage by means of a crossbar array configuration. In order to improve the assembly of a substrate and the metal layer, a prior art method for fabricating a ReRAM device comprises steps as follows: A recess is firstly formed on the substrate, and a barrier layer is then formed on the bottom and the sidewalls of the recess. A metal material, such as tungsten (W) is next filled into the recess to form a lower electrode layer. A metal oxide layer serving as the memory layer is subsequently formed on a top surface of the lower electrode layer by an oxidation process or a deposition process. Thereafter, an upper electrode layer is formed on the metal oxide layer.

However, since the process for forming the metal oxide layer cannot has processing limitation to make the metal oxide layer entirely covering on the top surface of the lower electrode layer, thus the corner formed by the sidewalls of the recess and the top surface of the lower electrode layer may be likely exposed. As a result, an undesired electrical contact may be formed between the lower electrode layer and the upper electrode layer subsequently formed on the metal oxide layer through the corner, and the current leakage occurring on the corner may lead the ReRAM device failure.

Therefore, there is a need of providing an improved memory device and a method for fabricating the same to obviate the drawbacks encountered from the prior art.

SUMMARY

One aspect of the present invention is to provide a memory device, wherein the memory device comprises a substrate, a first electrode layer, a spacer, a memory layer and a second electrode layer. The substrate has a recess. The first electrode layer is formed in the recess and has a top surface exposed from an opening of the recess. The spacer covers on a portion of the top surface, so as to define a contact area on the top surface. The memory layer is formed on the contact area. The second electrode layer is formed on the memory layer and electrically connected to the memory layer.

In accordance with another aspect of the present invention, a method for fabricating a memory device is provided, wherein the method comprises steps as follows: Firstly, a substrate having at least one recess is provided. A first electrode layer is then formed in the recess, wherein the first electrode layer has a top surface exposed from an opening of the recess. Next, a spacer is formed to cover on a portion of the top surface, so as to define a contact area on the top surface. Thereafter, a memory layer is formed on the contact area. Subsequently, a second electrode layer is formed on the memory layer to make the second electrode layer electrically connected to the memory layer.

In accordance with the aforementioned embodiments of the present invention, a memory device and a method for fabricating the same are disclosed. A first electrode layer is formed in a recess that is formed on a substrate. A spacer is then formed on a top surface of the first electrode layer to define a contact area. A memory layer is formed on the contact area, and a second electrode layer is subsequently formed on and electrically connected to the memory layer. By forming the spacer to cover the corner formed by the sidewalls of the recess and the top surface of the lower electrode layer, the current leakage occurring on the corner due to the undesired electrical contact formed between the lower electrode layer and the upper electrode layer can be avoided.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION

Figure 1A:
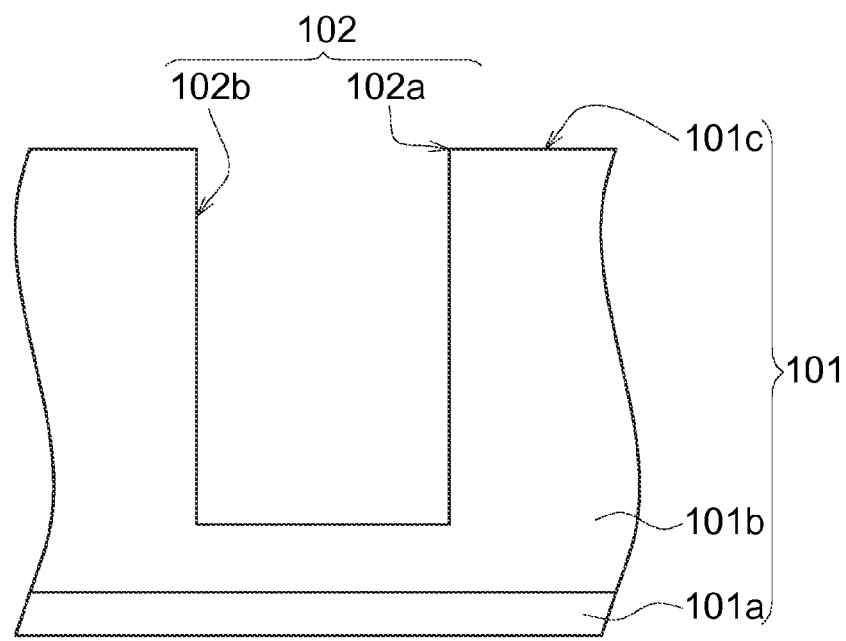
FIGS. 1A to 1F are cross-sectional views illustrating a series of processing structures for fabricating a ReRAM device in accordance with one embodiment of the present invention.

The embodiments as illustrated below provide a memory device and a method for fabricating the same to solve the problems of current leakage due to the undesired electrical contact formed between the lower electrode layer and the upper electrode layer of the memory device. The present invention will now be described more specifically with reference to the following embodiments illustrating the structure and method for fabricating the memory device.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention.

In addition, the illustrations may not be necessarily be drawn to scale, and the identical elements of the embodiments are designated with the same reference numerals.

FIGS. 1A to 1F are cross-sectional views illustrating a series of processing structures for fabricating a ReRAM device 100 in accordance with one embodiment of the present invention. The method for fabricating the ReRAM device 100 comprises several steps as follows: Firstly, a substrate 101 having at least one recess 102 is provided. In some embodiments of the present invention, the substrate 101 comprises a semiconductor base layer 101a and an insulating layer 101b; and the recess 102 vertically extends downwards into the insulating layer 101b (also referred to as the surface 102c of the substrate 101) form a surface 102c of the insulating layer 101b. In other words, the opening 102a of the recess is formed on the surface 102c of the insulating layer 101b (see FIG. 1A).

In some other embodiments of the present invention, the semiconductor base layer 101 a may be a wafer comprising poly-silicon or other elemental semiconductor, such as crystal germanium (Ge), compound semiconductor, such as silicon carbide (SiC), gallium arsenide (GaAs), gallium phosphide (GaP), iodine phosphide (IP), arsenic iodine (Asp or antimony iodide (SbI), or the arbitrary combinations thereof. In the present embodiment, the substrate is a wafer comprising poly-silicon. The insulating layer 101b comprises silicon dioxide (SiO$_2$).

Next, a first electrode layer 104 is formed in the recess 102, wherein the first electrode layer 104 has a top surface 104a exposing from the opening 102a of the recess 102. In some embodiments of the present invention, the first electrode layer 104 can be formed by a low pressure chemical vapor deposition (LPCVD) or other suitable processes; and the first electrode layer 104 may be a conductive layer comprising metal material, such as copper (Cu), aluminum (Al), tungsten (W), titanium (Ti) or the arbitrary combinations thereof, non-metallic material or the combination thereof. In the present embodiment, the first electrode preferably is made of W.

Figure 1B:
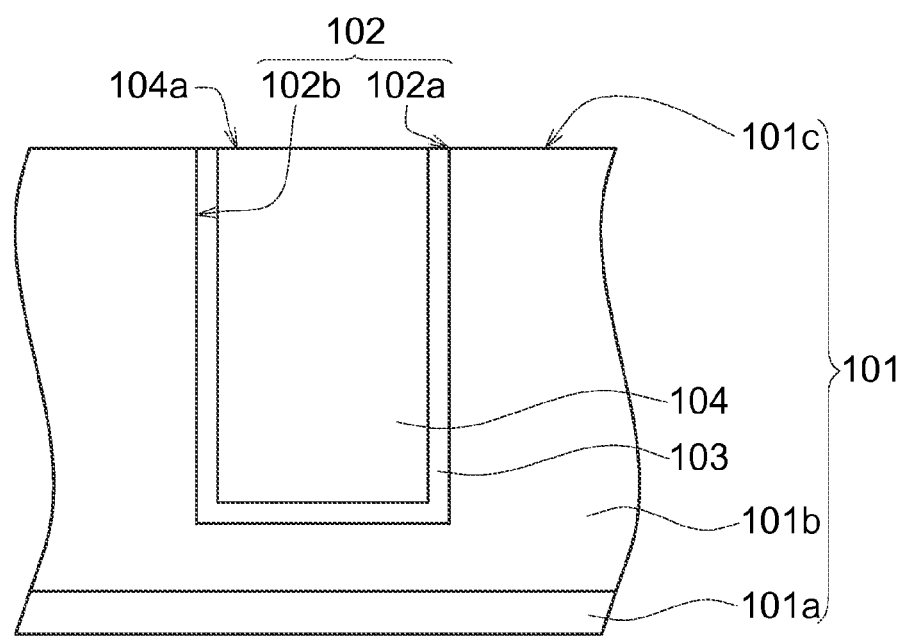
Figure 1C:
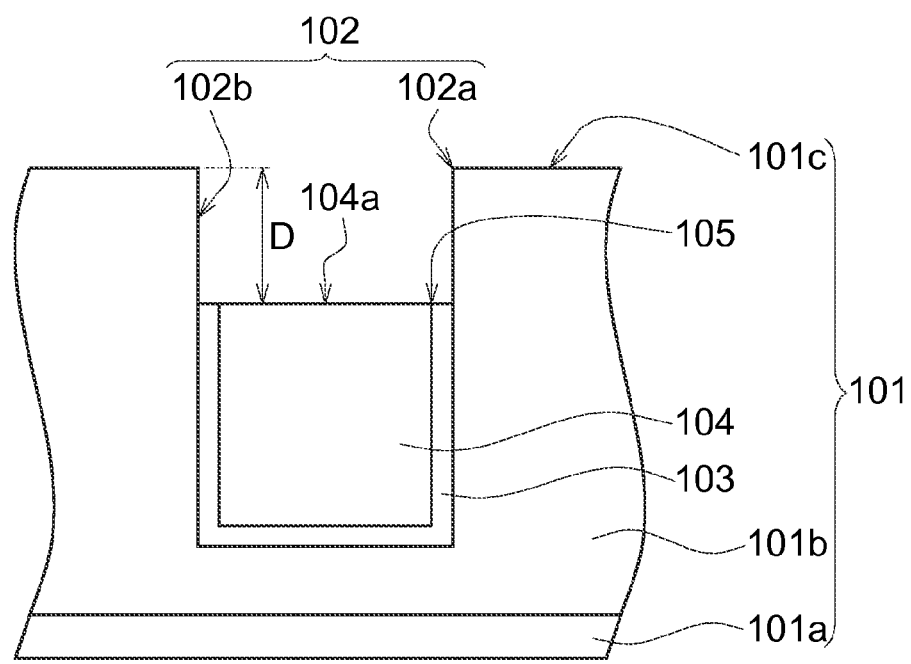
Figure 1D:
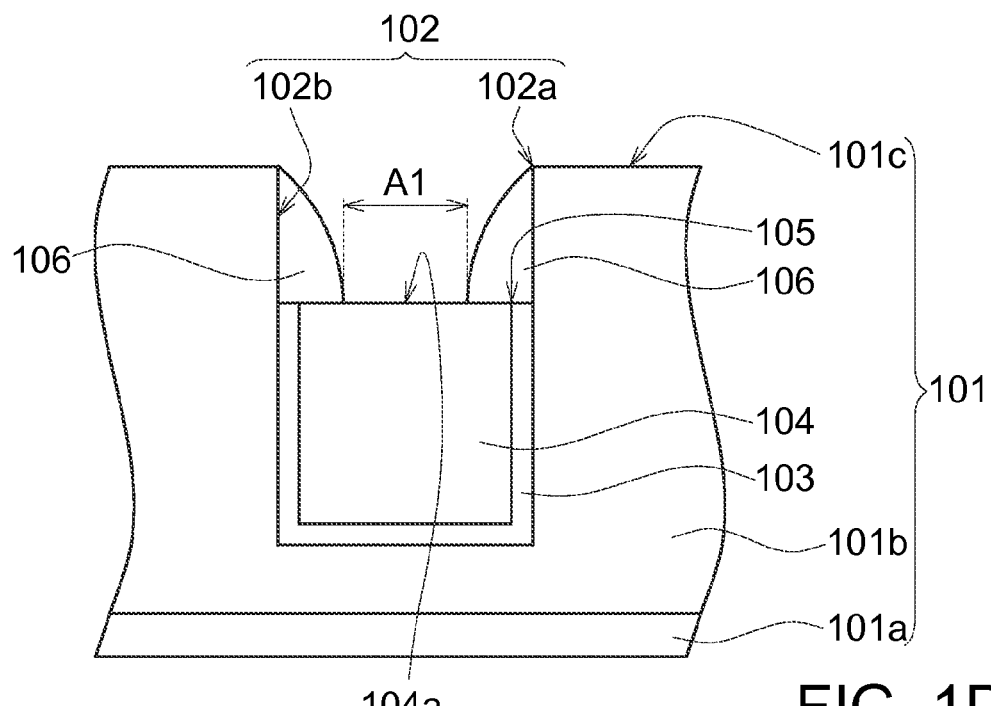
Figure 1E:
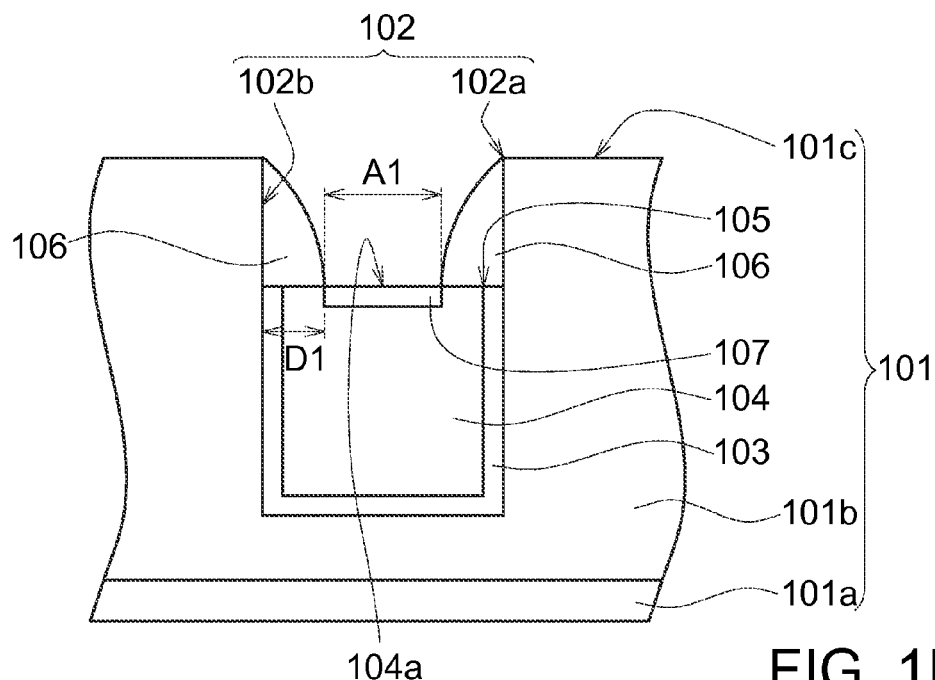
Figure 1F:
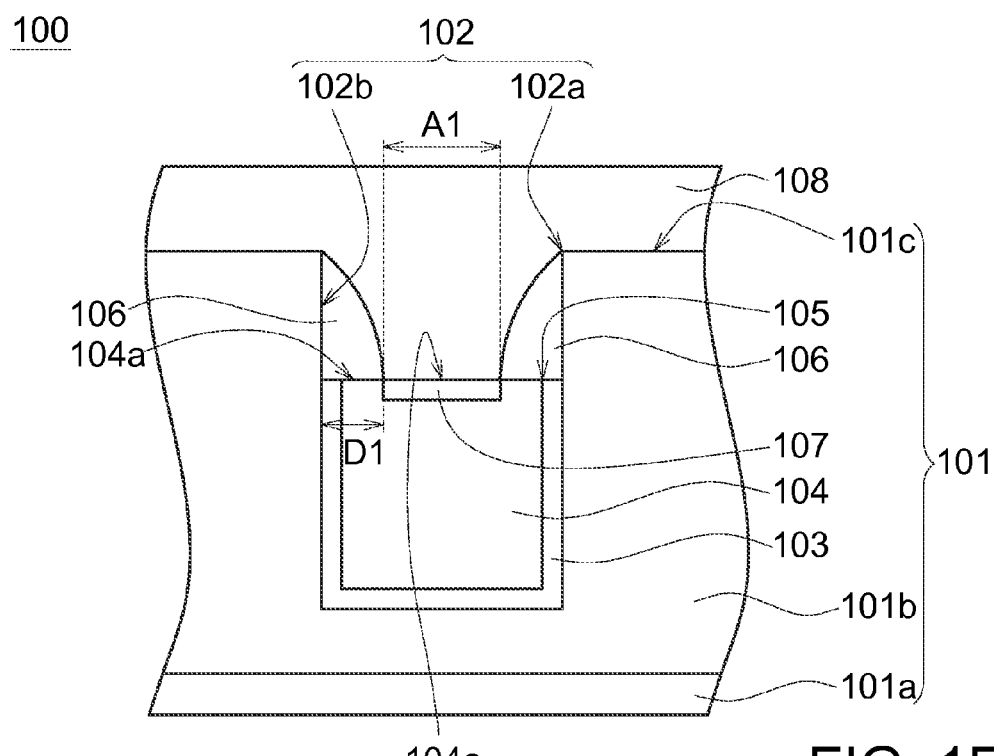

In some embodiments of the present invention, prior to the forming of the first electrode layer 104, an optional barrier layer 103 may be formed on the bottom and sidewalls 102b of the recess 102 (see FIG. 1B). The barrier layer 103 also can be formed by a LPCVD process; and the barrier layer 103 is preferably made of titanium nitride (TiN).

An etch back process is then performed to remove portions of the barrier 103 and the first electrode layer 104, so as to expose a portion of the sidewalls 102b adjacent to the opening 102a of the recess 102. As a result, the top surface 104a of the first electrode layer 104 can have a height measured from the bottom of the substrate 101 substantially lower than that of the opening 102a of the recess 102 (see FIG. 1C). In the present embodiment, the top surface of the barrier layer 103 also has a level measured from the bottom of the substrate 101 substantially lower than that of the opening 102a of the recess 102; and the interface 105 formed between the barrier layer 103 and the first electrode layer 104 is also exposed form the opening 102a of the recess 102.

Thereafter, a spacer 106 is formed to cover a portion of the top surface 104a of the first electrode layer 104, so as to define a contact area A1 on the top surface 104a (see FIG. 1D), wherein the spacer 106 is formed on the portion of the sidewalls 102b exposed from the opening of the recess 102, and in contact with the barrier layer 103 and the first electrode layer 104. In some embodiments of the present invention, the spacer 106 can be formed by a deposition process, such as a LPCVD process; and the spacer 106 may be made of silicon nitride (SiN), silicon oxide (SiO), silicon oxynitride (SiON), the arbitrary combinations thereof or other suitable materials.

In the present embodiment, the spacer 106 is made of SiN and covers on the barrier layer 103 and the interface 105 formed between the barrier layer 103 and the first electrode layer 104 as well as forms a ring to cover a portion of the top surface 104a of the first electrode layer 104, whereby the contact area A1 is defined on the top surface 104a and exposed from ring-shaped spacer 106. In the embodiments of the present invention, the contact area A1 has a size substantially smaller than that of the recess 102. In other words the contact area A1 is separated from the sidewalls 102b of the recess 102 by a certain distance.

A memory layer 107 is then formed on the contact area A1. In some embodiments of the present invention, the memory layer 107 comprises metal oxide, such as tungsten oxide (WOx) or hafnium oxide (HfOx). In some embodiments of the present invention, the memory layer 107 may be formed on the contact area A1 by a deposition process. In some other embodiments, the memory layer 107 may be formed by an oxidation process, such as a thermal oxidation process, directly performed on the contact area A1 of the first electrode 104 layer.

In the present embodiment, the forming of the memory layer 107 comprises performing a thermal oxidation on the contact area A1 of the first electrode layer 104 to form a WOx layer. Because the memory layer 107 is formed in on the contact area A1 of the first electrode layer 104 without extending beyond the top surface 104a of the first electrode layer 104, the memory layer 107 is thus separated from the barrier layer 103 by a certain distance and separated from the sidewalls 102b of the recess 102 by another distance (see FIG. 1E). In the present embodiment, the distance D1 between the contact area A1 and the sidewalls 102b of the recess 102 is substantially greater than 5 nanometers (nm).

Subsequently, a second electrode layer 108 is formed on the memory layer 107, so as to make the second electrode layer 108 electrically connected to the memory layer 107 (see FIG. 1F), meanwhile to form the ReRAM device 100. The method and material for forming the second electrode layer 108 may be either identical to or different form that for forming the first electrode layer 104. In the present embodiment, the second electrode layer 108 is also formed by a deposition process, such as a LPCVD process; and the material used to form the second electrode layer 108 also comprises W.

Refer to FIG. 1F again, the ReRAM device 100 formed by the aforementioned embodiment may comprises a substrate 101, a barrier layer 103, a first electrode layer 104, a spacer 106, a memory layer 107 and a second electrode layer 108. The substrate 101 has a recess 102. The first electrode layer 104 is formed in the recess 102 and has a top surface 104a exposed from an opening 102a of the recess 102. The barrier layer 103 is disposed on the sidewalls 102b of the recess 102 to separate the first electrode layer 104 from the substrate 101. The spacer 106 covers on the barrier layer 103 and a portion of the top surface 104a, so as to define a contact area A1 on the top surface 104a. The memory layer 107 is formed on the contact area A1. The second electrode layer 108 is formed on the memory layer 107 and electrically connected to the memory layer 107.

FIGS. 2A to 2E are cross-sectional views illustrating a series of processing structures for fabricating a ReRAM device 200 in accordance with another embodiment of the present invention. The method for fabricating the ReRAM device 200 comprises several steps as follows: Firstly, a substrate 101 having at least one recess 102 is provided. Since the substrate 101 that are used for fabricating the ReRAM devices 100 and 200 are identical to that for fabricating the ReRAM device 200, thus the structure and the material of the substrate 101 used for fabricating the ReRAM device 200 are not redundantly described. The process for fabricating the ReRAM device 200 may continue from FIG. 2A.

A first electrode layer 204 is then formed in the recess 102, wherein the first electrode layer 204 has a top surface 204a exposing from the opening 102a of the recess 102. In some embodiments of the present invention, prior to the forming of the first electrode layer 204, an optional barrier layer 203 may be formed on the bottom and sidewalls 102b of the recess 102 (see FIG. 2A). Since the method and materials for forming the first electrode layer 204 and the barrier layer 203 has described in the aforementioned embodiments, thus it will not be redundantly described there.

Figure 2A:
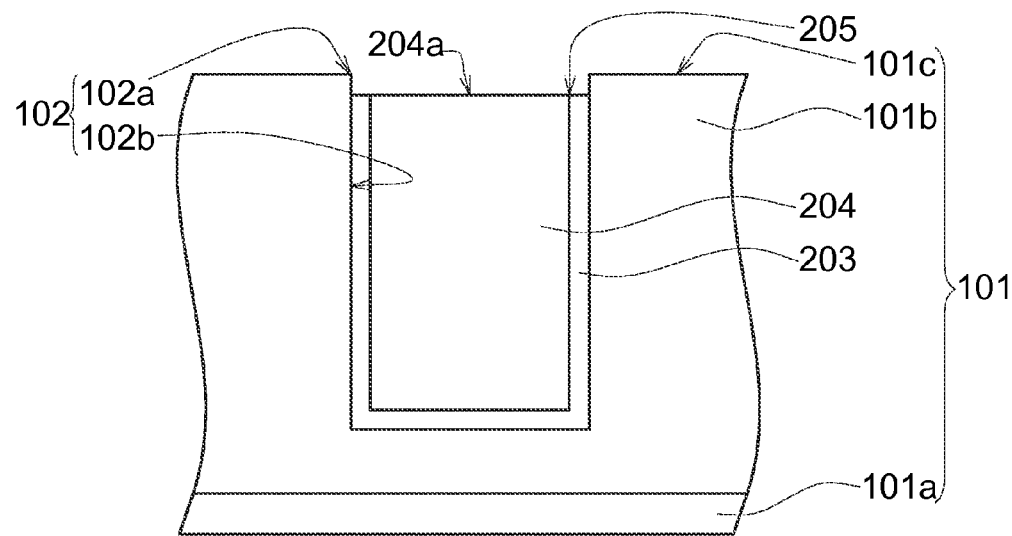
FIGS. 2A to 2E are cross-sectional views illustrating a series of processing structures for fabricating a ReRAM device in accordance with another embodiment of the present invention.
Figure 2B:
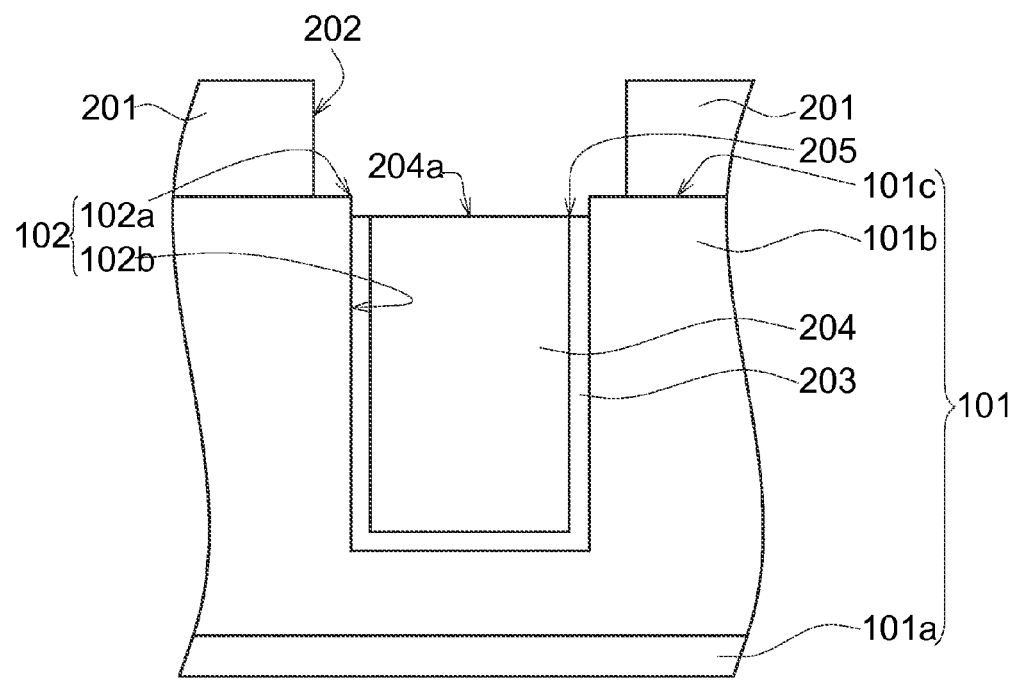
Figure 2C:
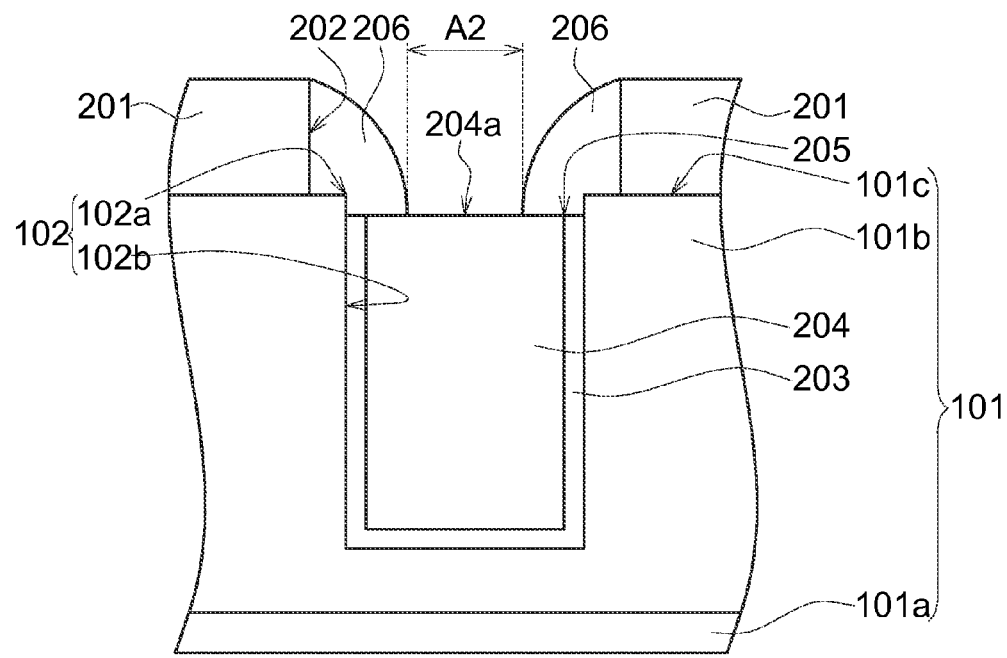
Figure 2D:
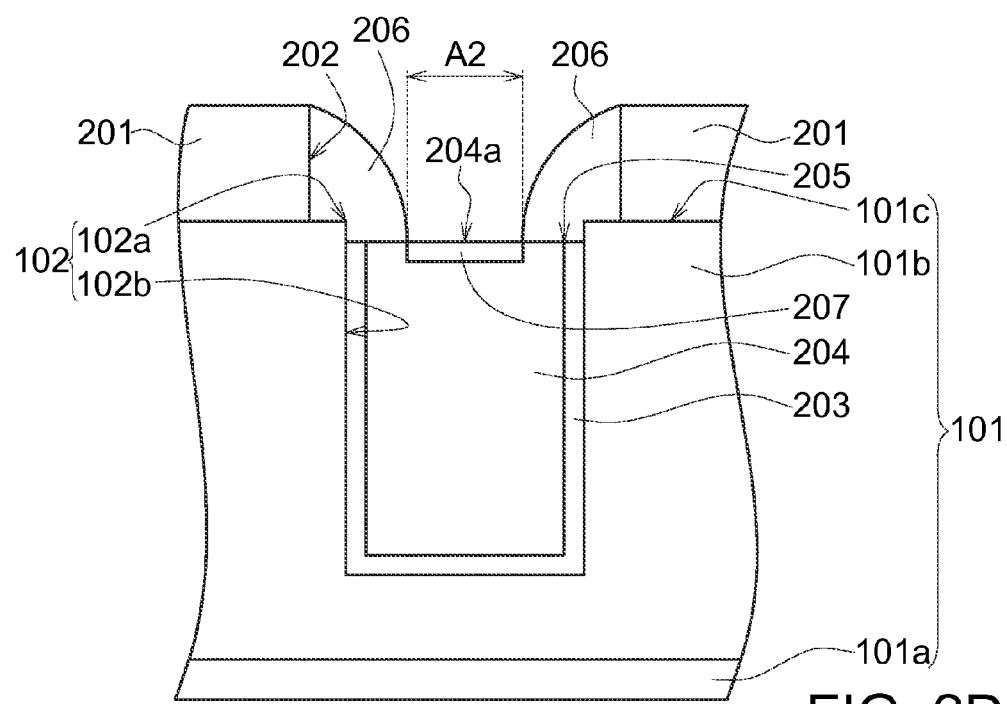
Figure 2E:
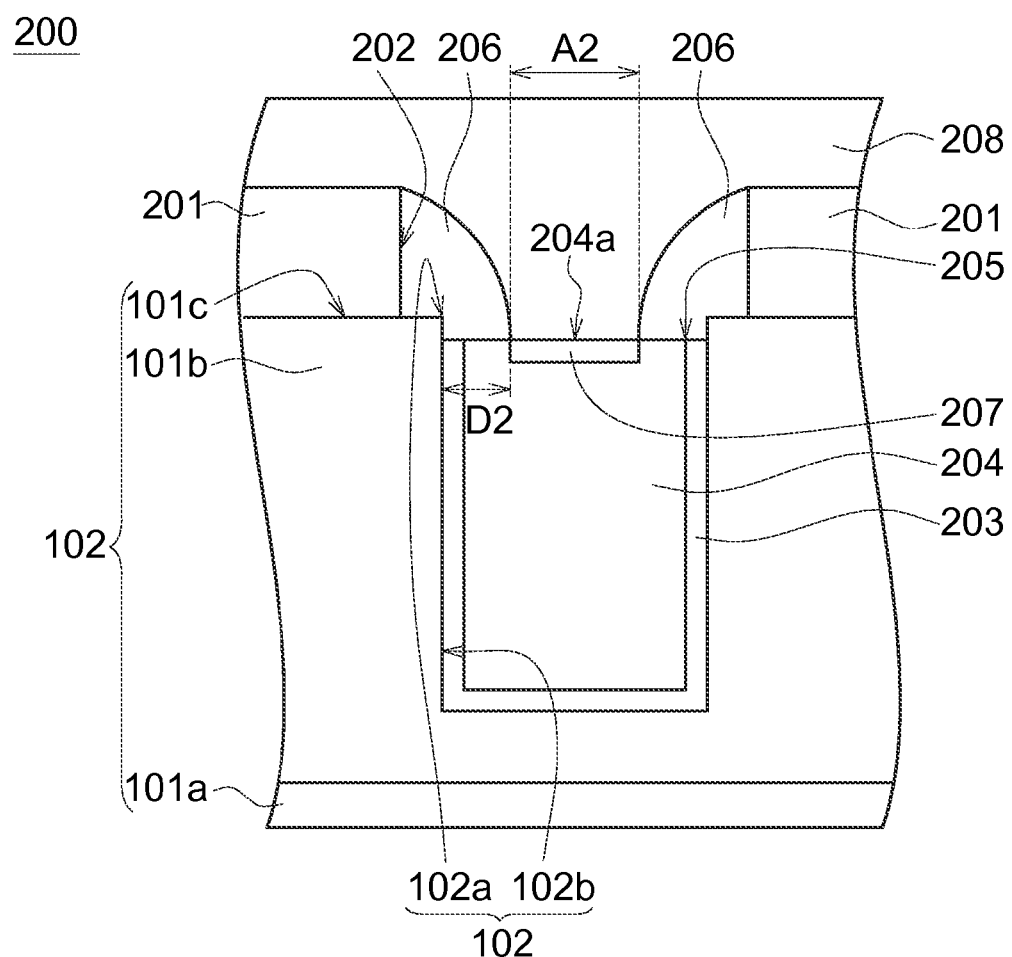

Next, a dielectric layer 201 is formed on the surface 101c of the insulating layer 101b (also referred to as the surface 102c of the substrate 101), and the dielectric layer 201 is then patterned to form at least one through hole 202 surrounding the opening 102a of the recess 102, whereby a portion of the surface 101c of the insulating layer 101b and the entire opening 102a of the recess 102 are exposed form the through hole 202 (see FIG. 2B). In some embodiments of the present invention, the dielectric layer 201 can be formed by a deposition process, such as a LPCVD process; and the dielectric layer 201 may be made of SiN, SiO, SiON, SiC, the arbitrary combinations thereof or other suitable materials. In the present embodiment, the dielectric layer 201 is made of SiN.

Thereafter, a spacer 206 is formed to cover a portion of the top surface 204a of the first electrode layer 204, so as to define a contact area A2 on the top surface 204a (see FIG. 2C), wherein the spacer 206 is formed on the sidewalls 201a of the through hole 202a and extending into the recess 102, so as to be in contact with the barrier layer 203 and the first electrode layer 204. In the present embodiment, the spacer 206 covers on the barrier layer 203 and the interface 205 formed between the barrier layer 203 and the first electrode layer 204 as well as forms a ring to cover a portion of the top surface 204a of the first electrode layer 204, whereby the contact area A2 is defined on the top surface 204a and exposed from the ring-shaped spacer 206. The contact area A2 has a size substantially smaller than that of the recess 102. In other words, the contact area A2 is separated from the barrier layer 203 by a certain distance and separated from the sidewalls 102b of the recess 102 by another distance.

A memory layer 207 is then formed on the contact area A2. Because the memory layer 207 is formed in on the contact area A2 of the first electrode 204 without extending beyond the top surface 204a of the first electrode 204, the memory layer 207 is thus separated from the barrier layer 203 by a certain distance and separated from the sidewalls 102b of the recess 102 by another distance (see FIG. 2D). In the present embodiment, the distance D2 between the contact area A2 and the sidewalls 102b of the recess 102 is substantially greater than 5 nm.

Subsequently, a second electrode layer 208 is formed on the memory layer 207, so as to make the second electrode layer 208 electrically connected to the memory layer 207 (see FIG. 2E), meanwhile to form the ReRAM device 200.

Refer to FIG. 2E again, the ReRAM device 200 formed by the aforementioned embodiment may comprises a substrate 101, a dielectric layer 201, a barrier layer 203, a first electrode layer 204, a spacer 206, a memory layer 207 and a second electrode layer 108. The substrate 101 has a recess 102. The first electrode layer 204 is formed in the recess 102 and has a top surface 204a exposed from an opening 102a of the recess 102. The barrier layer 203 is disposed on the sidewalls 102b of the recess 102 to separate the first electrode layer 204 from the substrate 101. The dielectric layer 201 is disposed on the substrate 101 and has a through hole 202 surrounding the recess 102. The spacer 206 covers on the barrier layer 203 and a portion of the top surface 204a, so as to define a contact area A2 on the top surface 204a. The memory layer 207 is formed on the contact area A2. The second electrode layer 208 is formed on the memory layer 207 and electrically connected to the memory layer 207.

In accordance with the aforementioned embodiments of the present invention, a memory device and a method for fabricating the same are disclosed. A first electrode layer is formed in a recess that is formed on a substrate. A spacer is then formed on a top surface of the first electrode layer to define a contact area. A memory layer is formed on the contact area, and a second electrode layer is subsequently formed on and electrically connected to the memory layer. By forming the spacer to cover the corner formed by the sidewalls of the recess and the top surface of the lower electrode layer, the current leakage occurring on the corner due to the undesired electrical contact formed between the lower electrode layer and the upper electrode layer can be avoided.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
   a substrate, having a recess;
   a first electrode layer, formed in the recess and having a first top surface exposed from an opening of the recess;
   a dielectric layer, formed on the substrate and having at least one through hole surrounding the opening of the recess;
   a spacer, formed on sidewalls of the through hole, extending into the recess and in contact with the first top surface and a second top surface of the substrate, so as to define a contact area on the first top surface;
   a memory layer, formed on the contact area; and
   a second electrode layer, formed on the memory layer and electrically connected to the memory layer.

2. The memory device according to claim 1, further comprising a barrier layer formed on sidewalls of the recess to separate the first electrode layer from the substrate, wherein the spacer covers the barrier layer.

3. The memory device according to claim 2, wherein the first top surface of the first electrode layer has a height measured from a bottom of the substrate substantially lower than that of the opening of the recess, and a portion of the spacer is formed on the sidewalls of the recess and in contact with the barrier layer and the first top surface.

4. The memory device according to claim 1, wherein the contact area has a size substantially smaller than that of the recess.

5. The memory device according to claim 1, wherein the contact area is separated from the sidewalls of the recess by a distance substantially greater than 5 nanometers (nm).

6. The memory device according to claim 1, wherein the substrate comprises silicon dioxide ($SiO_2$); the first electrode layer and the second electrode layer comprises tungsten (W); the memory layer comprises tungsten oxide ($WO_x$) or hafnium oxide ($HfO_x$); and the spacer comprises silicon nitride (SiN).

7. A method for fabricating a memory device, comprising:
providing a substrate having at least one recess;
forming a first electrode layer in the recess, wherein the first electrode layer has a first top surface exposed from an opening of the recess;
forming a dielectric layer on the substrate;
patterning the dielectric layer to form at least one through hole surrounding the opening of the recess;
forming a spacer on sidewalls of the through hole, extending into the recess and in contact with the first top surface and a second top surface of the substrate, so as to define a contact area on the first top surface;
forming a memory layer on the contact area; and
forming a second electrode layer on the memory layer to make the second electrode layer electrically connected to the memory layer.

8. The method according to claim 7, prior to the process of forming of the first electrode layer, further comprising steps of forming a barrier layer on sidewalls of the recess.

9. The method according to claim 8, prior to the process forming the spacer, further comprising steps of performing a back etching process to remove portions of the barrier and the first electrode layer, so as to expose a portion of the sidewalls of the recess and to make the first top surface of the first electrode layer having a height measured from a bottom of the substrate substantially lower than that of the opening of the recess.

10. The method according to claim 9, wherein a portion of the spacer is formed on the sidewalls of the recess and in contact with the barrier layer and the first top surface.

11. The method according to claim 7, wherein the process of forming the memory layer comprises steps of performing a thermal oxidation on the contact area of the first electrode to form a metal oxide layer.

12. The method according to claim 7, wherein the process of forming the memory layer comprises steps of performing a deposition process form a metal oxide layer on the contact area of the first electrode.

13. The method according to claim 7, wherein the process of forming the spacer comprises steps of defining the contact area with a size substantially smaller than that of the recess.

14. The method according to claim 13, wherein the contact area is separated from the sidewalls of the recess by a distance substantially greater than 5 nanometers.

* * * * *